(12) United States Patent
Tiebout

(10) Patent No.: US 6,646,499 B2
(45) Date of Patent: Nov. 11, 2003

(54) VOLTAGE-CONTROLLED CAPACITOR

(75) Inventor: Marc Tiebout, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/288,388

(22) Filed: Nov. 5, 2002

(65) Prior Publication Data

US 2003/0071682 A1 Apr. 17, 2003

Related U.S. Application Data

(63) Continuation of application No. PCT/EP01/05035, filed on May 4, 2001.

(30) Foreign Application Priority Data

May 5, 2000 (DE) .......................... 100 21 867

(51) Int. Cl.[7] .............................................. H03K 17/00
(52) U.S. Cl. ...................................................... 327/586
(58) Field of Search ................................. 327/551, 552, 327/553, 583, 586

(56) References Cited

U.S. PATENT DOCUMENTS

| | | | |
|---|---|---|---|
| 3,808,517 A | | 4/1974 | Fletcher et al. |
| 5,130,564 A | * | 7/1992 | Sin .............................. 327/264 |
| 5,378,937 A | * | 1/1995 | Heidemann et al. ........ 327/306 |
| 6,351,020 B1 | * | 2/2002 | Tarabbia et al. ............ 257/532 |

FOREIGN PATENT DOCUMENTS

| | | |
|---|---|---|
| EP | 0 902 483 A1 | 3/1999 |
| EP | 1 024 538 A1 | 8/2000 |
| JP | 07153978 A | 6/1995 |

OTHER PUBLICATIONS

Andreani, P.: "A Comparison between Two 1.8GHz CMOS VCOs Tuned by Different Varactors", Proc. of the European Solid–State Circuits Conference (ESSCIRC'98), The Hague. Sep. 1998, pp. 380–383.

Craninckx, J. et al.: "A 1.8GHz CMOS Low–Phase–Noise Voltage–Controlled Oscillator with Prescaler", IEEE, vol. 30, No. 12, Dec. 1995, pp. 1474–1482.

* cited by examiner

*Primary Examiner*—Jeffrey Zweizig
(74) *Attorney, Agent, or Firm*—Laurence A. Greenberg; Werner H. Stemer; Ralph E. Locher

(57) ABSTRACT

A voltage-controlled capacitor is configured in such a way that it contains two varactors connected in parallel. The varactors are connected in such a way that a capacitance is controlled by differential signals. This layout results in a voltage-controlled capacitor that has an optimally low sensitivity to interference.

4 Claims, 2 Drawing Sheets

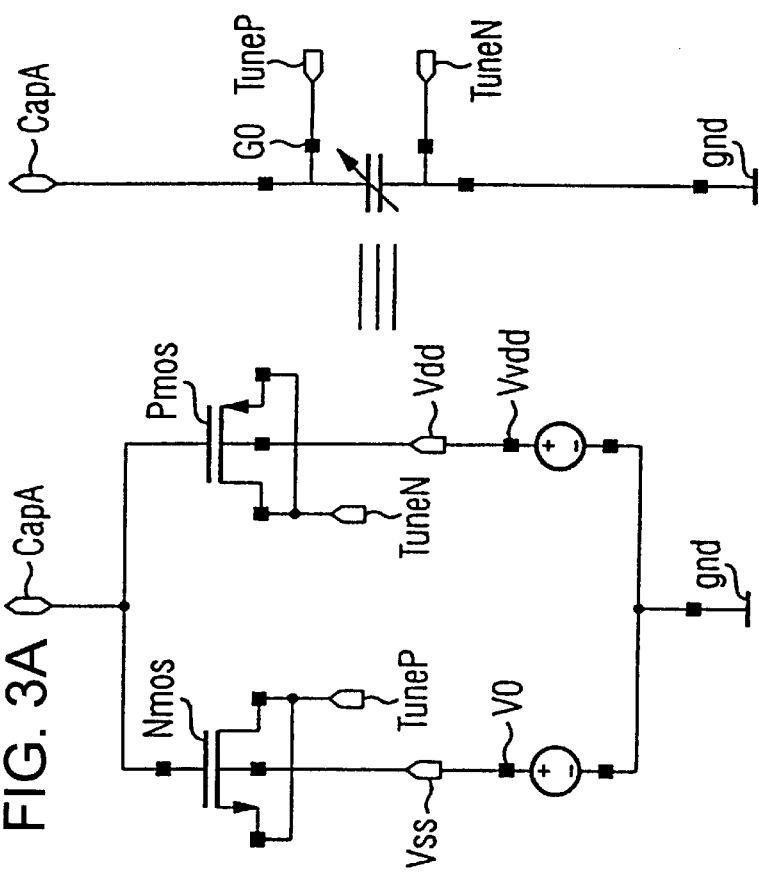
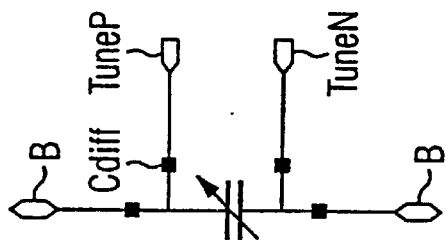
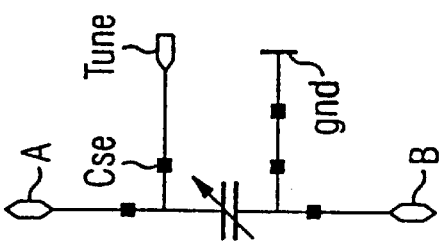

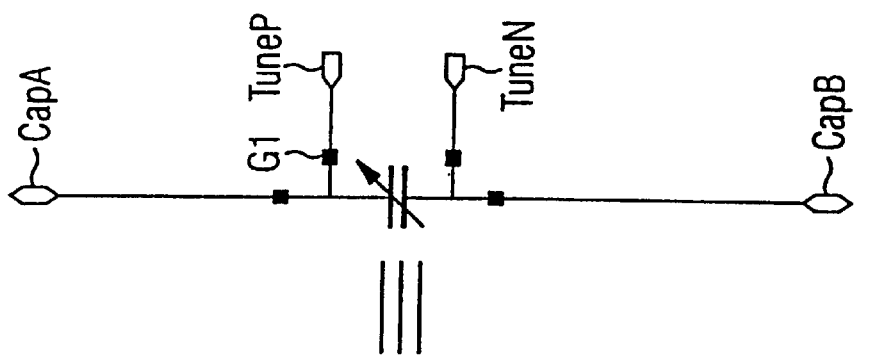
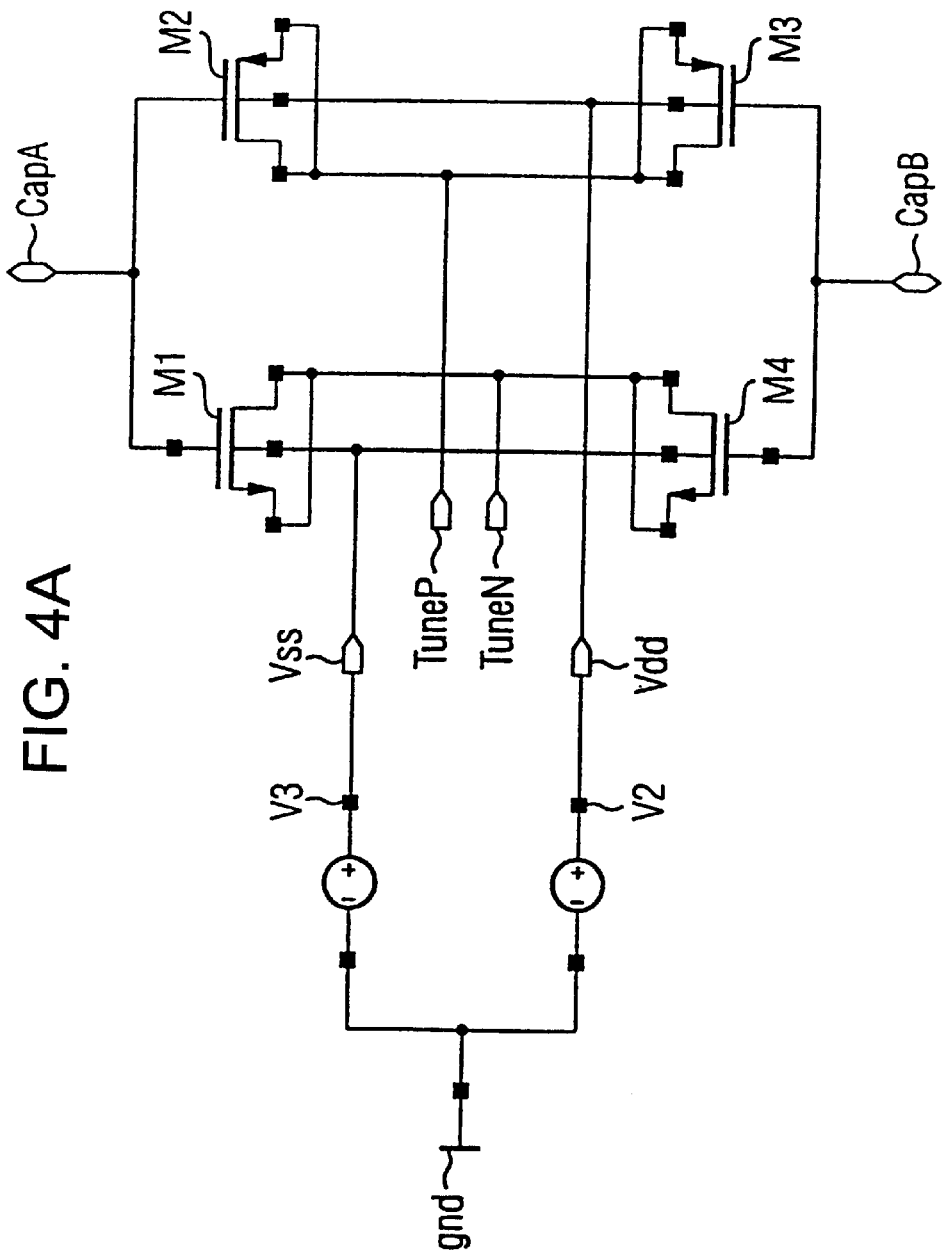
FIG. 4B
FIG. 4A

VOLTAGE-CONTROLLED CAPACITOR

CROSS-REFERENCE TO RELATED APPLICATION

This application is a continuation of copending International Application No. PCT/EP01/05035, filed May 4, 2001, which designated the United States and was not published in English.

BACKGROUND OF THE INVENTION

Field of the Invention

The invention relates to a voltage-controlled capacitor.

Known voltage-controlled capacitors (varactors) are utilized particularly in voltage-controlled oscillators.

Controlled capacitors of the species are described in the references titled "A 1.8 GHz CMOS Low-Phase-Noise Voltage-controlled Oscillator with Prescaler" (Jan Craninckx and M. S. J. Steyaert, *IEEE Journal of Solid-State Circuits*, vol. 30, No. 12, December 1995) and in "A Comparison Between Two 1.8 GHz CMOS VCOs Tuned by Different Varactors" (*Proc. of the European Solid-State Circuits Conference* (ESSCIRC'98), pp. 380–83, The Hague, September 1998).

A unique feature of voltage-controlled oscillators is that their frequency can be controlled by a voltage thereat. When they are utilized in the high-frequency band, it is possible to tune their oscillation behavior by a voltage-controlled capacitor, i.e. a varactor.

SUMMARY OF THE INVENTION

It is accordingly an object of the invention to provide a voltage-controlled capacitor, that overcomes the above-mentioned disadvantages of the prior art devices of this general type, which defines a lay out for the voltage-controlled capacitor that has an optimally low sensitivity to interference.

With the foregoing and other objects in view there is provided, in accordance with the invention, a voltage-controlled capacitor. The voltage-controlled capacitor has two varactors connected in parallel. The two varactors are connected such that their capacitance is controlled by difference signals.

The object is inventively achieved by equipping a voltage-controlled capacitor such that it contains parallel varactors that are connected such that the capacitance is controlled by difference signals.

It is expedient that the capacitance is controlled by difference signals between the two varactors.

It is advantageous to configure the voltage-controlled capacitor such that one varactor contains an nmos layer sequence, and the other varactor contains a pmos layer sequence.

Other features which are considered as characteristic for the invention are set forth in the appended claims.

Although the invention is illustrated and described herein as embodied in a voltage-controlled capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a circuit diagram of a voltage-controlled varactor;

FIG. 2 is a circuit diagram of a differentially controlled varactor according to the invention;

FIG. 3A is a circuit diagram of a differentially controlled MOS varactor;

FIG. 3B is a circuit diagram of a circuit equivalent to the differentially controlled MOS varactor shown in FIG. 3A;

FIG. 4A is a circuit diagram of a differentially controlled floating MOS varactor; and FIG. 4B is a circuit diagram of a circuit equivalent to the differentially controlled floating MOS varactor shown in FIG. 4A.

DESCRIPTION OF THE PREFERRED EMBODIMENTS

Referring now to the figures of the drawing in detail and first, particularly, to FIG. 1 thereof, there is shown a varactor whose capacitance is dependent on a voltage between a base potential (gnd) and an input signal Tune: $C=f(V_{Tune})$.

An inventive varactor is represented in FIG. 2. The varactor forms a capacitance C, which depends on a difference between two voltages $C=f(V_{TuneP}-V_{TuneN})$.

Because nMOS and pMOS varactors are connected parallel to one another, the varactor is still controlled by a difference voltage and it does not respond to common mode signals. This creates a higher disturbance insensitivity and is particularly advantageous in high-density integrated chips (mixed mode chips). A differentially controlled MOS varactor is schematically represented in FIGS. 3A and 3B; a floating variant is represented in FIGS. 4A and 4B.

The advantages of the circuit are the ability to integrate it in CMOS or BICMOS processes and its improved mixed mode characteristics owing to the smaller disturbance sensitivity of uniformly differential signal paths.

The represented exemplifying embodiments of the invention contain an interconnection of nMOS and pMOS capacitors.

I claim:

1. A voltage-controlled capacitor, comprising:
   two varactors connected in parallel and having a capacitance, said two varactors being connected for controlling the capacitance with difference signals, and said two varactors including a first varactor having an nMOS layer sequence and a second varactor having a pMOS layer sequence.

2. The voltage-controlled capacitor according to claim 1, wherein the capacitance is controlled by the difference signals received between said two varactors.

3. The voltage-controlled capacitor according to claim 1, wherein said two varactors are formed from CMOS circuitry.

4. The voltage-controlled capacitor according to claim 1, wherein said two varactors are formed from BiCMOS circuitry.

* * * * *